United States Patent [19]

Schara et al.

[11] Patent Number: 4,875,461
[45] Date of Patent: Oct. 24, 1989

[54] AUTOMATIC DENDRITIC SILICON WEB SEPARATION MACHINE

[75] Inventors: Kristen T. Schara, Wilkinsburg; David B. Kulik, Jeannette; Scott E. McIlvaine, Acme, all of Pa.

[73] Assignee: Westinghouse Electric Corp., Pittsburgh, Pa.

[21] Appl. No.: 176,558

[22] Filed: Apr. 1, 1988

[51] Int. Cl.⁴ ............................................. B28D 1/32
[52] U.S. Cl. ............................ 125/23 R; 125/13 R; 83/879; 83/880
[58] Field of Search ............... 125/23 R, 24, 13 R, 125/21, 15; 83/879, 880, 886, 914, 875

[56] References Cited

U.S. PATENT DOCUMENTS

3,230,625  1/1966  Meyer ............................ 125/23 R
3,543,978  12/1970 Feillet ............................... 83/880
4,653,680  3/1987  Regan ............................ 125/23 R Primary Examiner—Frederick R. Schmidt
Assistant Examiner—Maurina Rachuba

[57] ABSTRACT

The present invention is directed to a machine for automatically cutting a dendritic silicon web into pieces of predetermined length. A first work station scribes the web to define a web piece of predetermined length. A second work station marks the web to enable further processing and breaks off the web piece. A mechanism for advancing the web by the predetermined length through the first and second work stations is provided.

15 Claims, 6 Drawing Sheets

AUTOMATIC DENDRITIC SILICON WEB SEPARATION MACHINE

BACKGROUND OF THE INVENTION

1. Field of the Invention

The present invention is directed generally to equipment capable of cutting a web into pieces of a predetermined length, and more particularly to a machine for automatically cutting long lengths of a dendritic silicon web into smaller pieces for further processing.

2. Background of the Invention

It is desirable to produce photovoltaic cells according to mass production techniques in order to achieve economies of scale. Currently, automated production of photovoltaic cells is carried out using silicon wafers which are round. The processing of such round wafers has lead to specialized equipment capable of manipulating, cutting, and storing such wafers. Unfortunately, such round wafers, when cut down into square or rectangular pieces, result in a large amount of waste. It is therefore desirable, in order to reduce waste and cut costs, to work with other shapes of single crystal silicon.

It is known that a single crystal dendritic silicon web can be grown up to lengths as long as seventeen meters. However, there is no equipment available for automatically processing such dendritic webs. Currently, the dendritic web must be manually cut to size using hand-held diamond tipped scribing tools. Such manual production techniques are not cost effective and do not provide for the accuracy and repeatability needed in order to produce a panel of photovoltaic cells. Therefore, there is a need for automated equipment capable of handling such dendritic webs.

SUMMARY OF THE PRESENT INVENTION

The present invention is directed to a machine for automatically cutting a dendritic silicon web into pieces of predetermined length. The machine includes a first work station for scribing the web to define a web piece of predetermined length. A second work station marks the defined web piece to identify a 90° corner for further processing and breaks the web piece of predetermined length from the dendritic web. An assembly is provided for advancing the dendritic web by the predetermined length through the first and second work stations.

In one embodiment of the present invention, the first work station includes an automatic diamond tipped scribe arm. Other embodiments of the present invention may include the use of a water knife of laser for performing the function of the first and second work stations.

The machine of the present invention enables long lengths of a dendritic web to be automatically cut to precise predetermined lengths for further processing. In addition to cutting the dendritic web to predetermined lengths, each piece is marked to enable further processing. The machine of the present invention thus provides for the automatic cutting of a dendritic silicon web into pieces of predetermined length in a repeatable fashion. Such a machine enables mass production techniques to be applied to the processing of such webs thereby resulting in economy of scales. These and other advantages and benefits of the present invention will become apparent from a description of a preferred embodiment hereinbelow.

BRIEF DESCRIPTION OF THE DRAWINGS

In order that the present invention may be clearly understood and readily practiced, preferred embodiments will now be described, by way of example only, with reference to the accompanying figures wherein.

DESCRIPTION OF A PREFERRED EMBODIMENT

Figure 1:
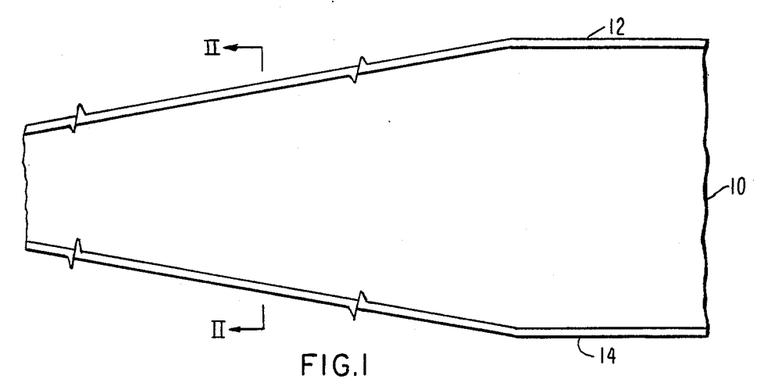
FIG. 1 is a plan view of a dendritic web.
Figure 2:
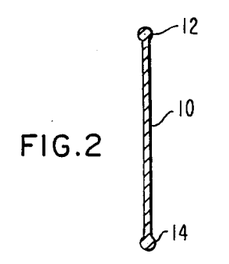
FIG. 2 is a sectional view of the web of FIG. 1 taken along the lines II—II.

A silicon web 10 is grown according to known techniques between two dendrites 12 and 14 as shown in FIG. 1. The web 10 is a single crystal of silicon which is drawn from a reservoir of molten silicon in such a manner that the width of the web 10 continues to increase until some predetermined width is achieved. Because the web 10 extends between the dendrites 12, 14, the web 10 may be referred to as dendritic web. A cross-sectional view of the dendritic web 10 is seen in FIG. 2. The dendritic web 10 may have a maximum width of, for example, 78 mm.

Figure 3:
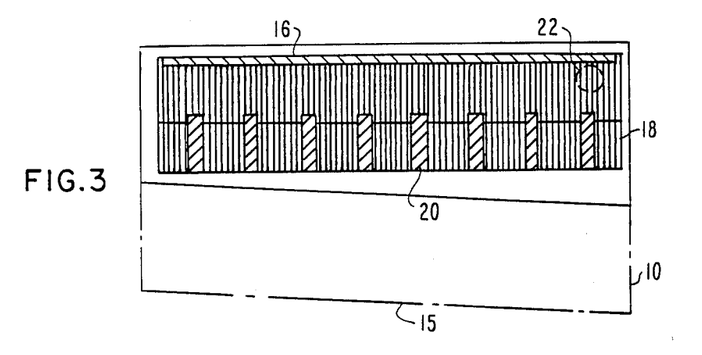
FIG. 3 shows the orientation of a photovoltaic cell on a piece of the web of FIG. 1.

The dendritic web 10 shown in FIG. 1 may be cut into convenient lengths in order to form photovoltaic cells according to known processing techniques. A portion 15 of the dendritic web 10 cut to accommodate a single photovoltaic cell 16 is illustrated in FIG. 3. It can be seen that the photovoltaic cell 16 is positioned on a portion of the dendritic web 10 before the dendritic web 10 has achieved its maximum width. Because of that, the piece 15 of the web 10 illustrated in FIG. 3 can be referred to as a trapezoid.

The construction of the photovoltaic cell 16 on the piece 15 of the dendritic web 10 shown in FIG. 3 is accomplished by depositing a plurality of copper conductors 18 as well as copper conductive pads 20. Because the same configuration of copper conductors 18 and copper pads 20 must be deposited on the opposite side of the web 10 in exact registration with the already deposited conductors 18 and pads 20, it is necessary to include a mark, such as the scribed circle 22, to identify a 90° corner of the web piece 15. By virtue of the scribed circle 22, it is possible to line up the masks for depositing the copper conductors 18 and copper pads 20 to achieve precise registration between the patterns on the two sides of the web piece 15.

Illustrated in FIGS. 4 and 4A and FIGS. 5 and 5A are a plan view and a side view, respectively, of an automatic dendritic silicon web separating machine 24 constructed according to the teachings of the present invention. The machine 24 is capable of processing long lengths of a dendritic silicon web to provide lengths suitable for photovoltaic cell fabrication. In addition to providing pieces of web of a suitable length, each piece is provided with a mark such as scribed circle 22 to identify a 90° corner for purposes of fabrication. Finally, after the machine 24 has cut and marked the web pieces, the machine 24 loads the web pieces into boats, or cassettes, for further processing at subsequent stations. The machine 24 is capable of automatically and reproducibly producing web pieces to tight tolerances for purposes of mass production.

The machine 24 is comprised of an elongated table 26. A pusher bar 28 capable of traveling the majority of the length of the table 26 is provided for pushing the dendritic web. The pusher bar 28 is connected to a push plate 30. The push plate 30 is rigidly connected to a ball nut 32, seen most clearly in FIG. 6, which ball nut rides on a ball screw 34. Rotation of the ball screw 34 is accomplished by an electric motor 36 operating through a belt 38. The ball screw 34 may be supported in pillow blocks 40 by appropriate support bearings 42.

Figure 6:
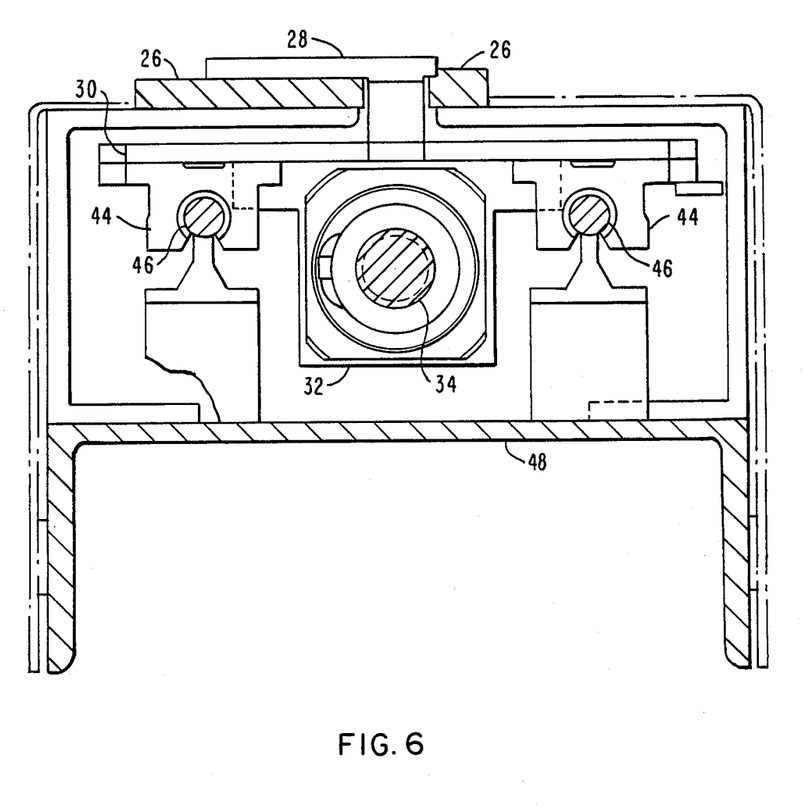
FIG. 6 is a sectional view taken along the lines VI—VI in FIG. 5.

The push plate 30 has rigidly attached thereto a pair of shaft guides 44 best seen in FIG. 6. The shaft guides cooperate with a pair of shafts 46 rigidly attached to the base 48 of the machine to prevent rotation of the push plate 30 thereby causing the translation of the rotational motion of the ball screw 34 into linear motion of the push plate 30. The shaft guides 44 and shafts 46 also insure proper movement of the push plate 30 along the table 26. The purpose of the pusher bar 28 and associated components which provide movement thereof is to push the dendritic web along the table 26 to a first work station 50 shown in FIG. 4A.

Figure 4:
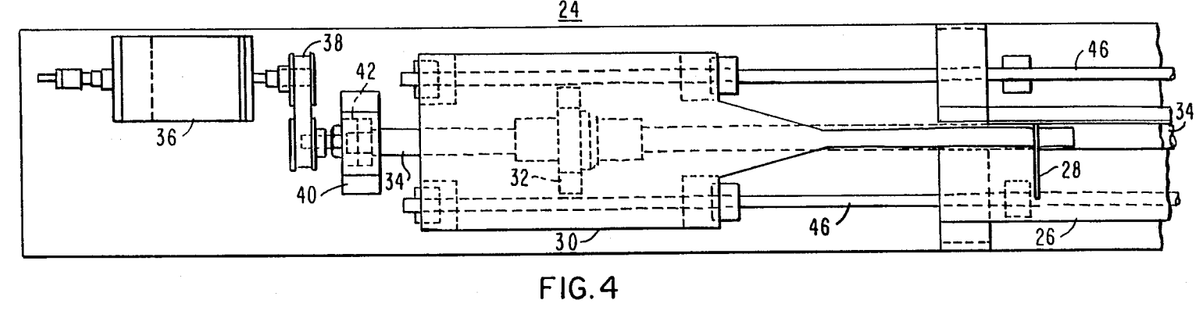
FIGS. 4 and 4A are plan views of an automatic dendritic silicon web separating machine constructed according to the teachings of the present invention.
Figure 4A:
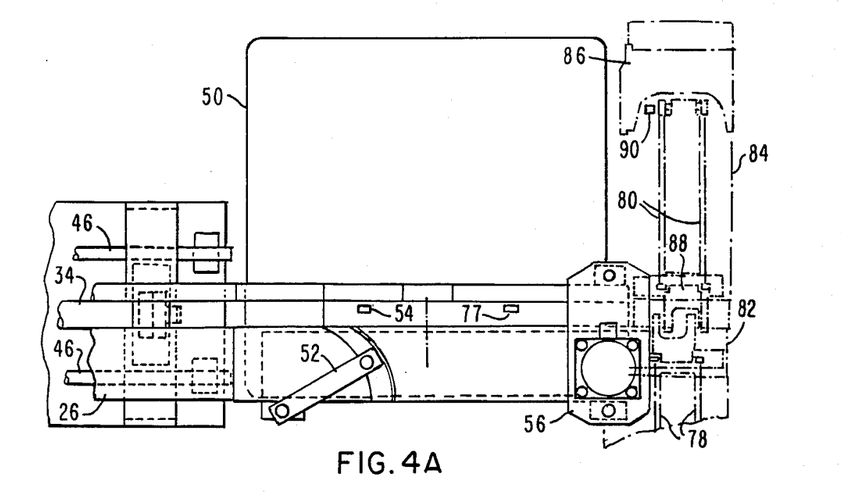
Figure 5:
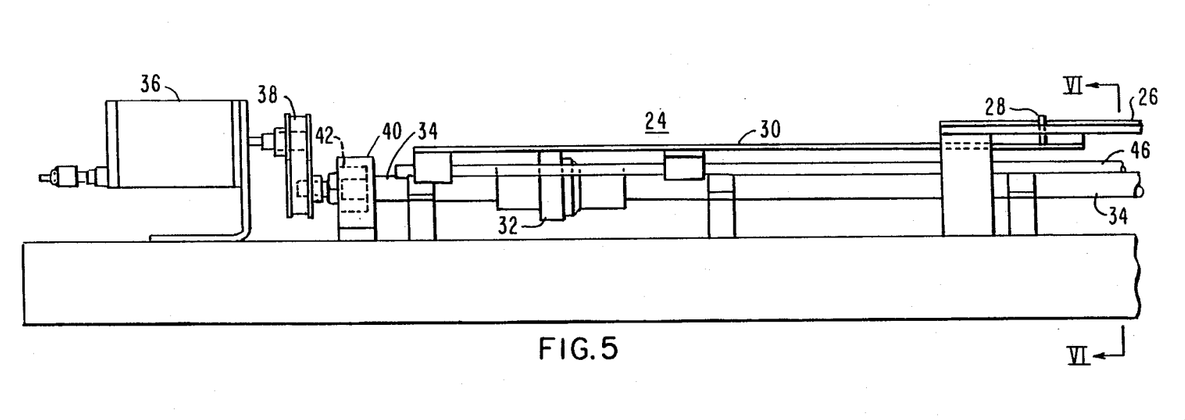
FIGS. 5 and 5A are side views of the machine shown in FIGS. 4 and 4A.
Figure 5A:
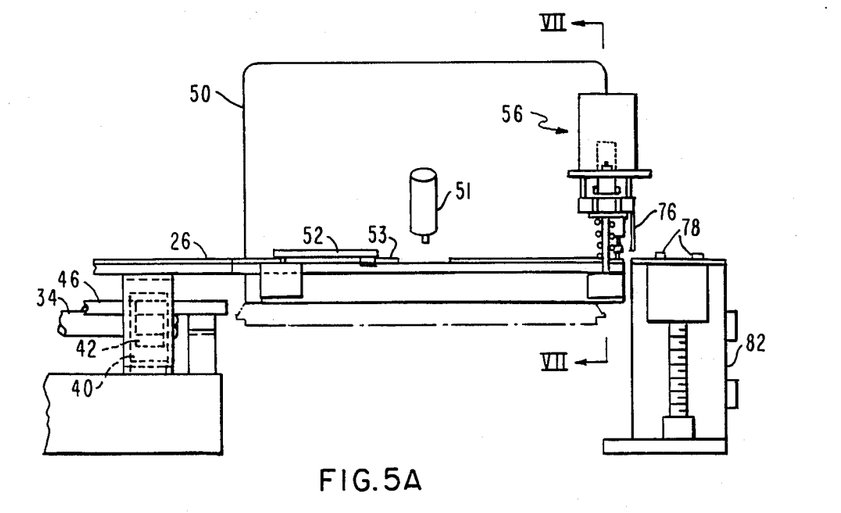

The work station 50 may take the form of a commercially available scribing machine such as a Loomis MKT-40, a laser, or a water knife. The Loomis MKT-40 is provided with a work table for processing round silicon wafers. In order that the Loomis machine may be used in conjunction with the present invention, the work table provided with the machine must be removed. An arm 51 of the work station 50 may take the form of a diamond tipped scribe arm when the Loomis machine is used, a laser, or a water jet when a water knife is used. When the Loomis machine is used, the arm 51 is pulled out over the web by supplying a vacuum thereto. When the vacuum is released, the web is scribed by the arm 51 as it returns to its start position. One unique feature of the Loomis machine is that the pressure on the arm 51 is maintained by an air spring system which allows the diamond tipped arm 51 to conform to the contours of the web while applying an even pressure.

In a prototype machine 24 which was built, the Loomis machine was purchased without the standard X-Y stage used for holding and moving conventional round wafers. The web strip rested on the table 26 which may be made of an ultra-high molecular weight polyethylene. Such material was chosen because pure silicon cannot contact metal at this stage of processing. Additionally, the polyethylene provides a low friction surface for easy sliding. The push plate 30, which supports the pusher bar 28, was designed with a long tongue to extend over the Loomis machine so that the original Loomis casting did not have to be modified to accept the drive system of the prototype. The ball screw 34 was rotated by the stepper motor 36 through the timing belt 38 to cause movement of the web.

In the automatic mode, the motor 36 is energized so as to index the web at precise steps, for example, 10.3 cms. Such stepping causes successive pieces of the web to be oriented under the arm 51 of the Loomis machine. A jog mode may be provided to move the web into position before starting the automatic cycle. A spring loaded arm 52 justifies the web along a fence 53 cut in the table 26 which fence is perpendicular to the path of the arm 51.

Finally, a sensor 54 may be provided to indicate the presence of the web to avoid inadvertent operation of the arm 51 of the Loomis machine. The sensor may be a photoreflective type of sensor such as the OPB series available from TRW, Inc.

Figure 7:
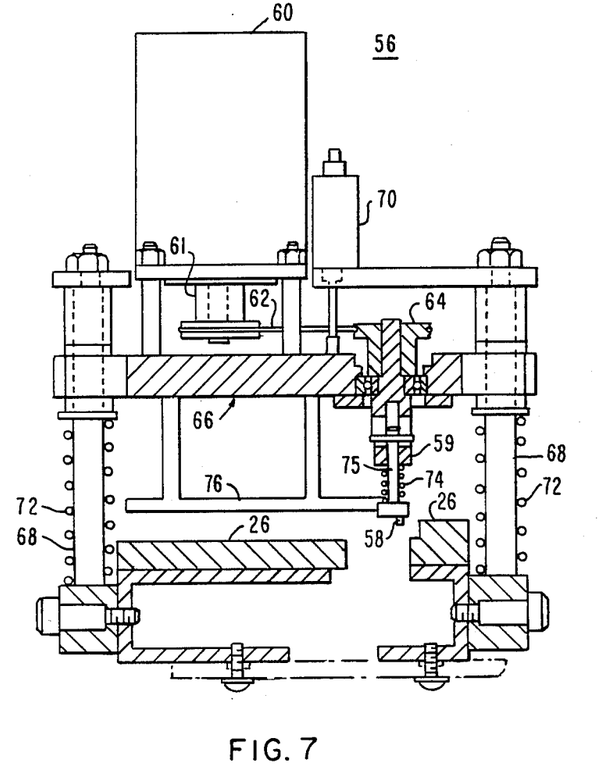
Fig. 7 is a section view taken along the lines VII—VII in FIG. 5A.

After the web has been scribed, operation of the motor 36 positions the previously scribed piece of the web at a second work station which may take the form of a circular scribe and breakoff assembly 56, which is seen most clearly in FIG. 7. The circular scribe and breakoff assembly 56 includes a diamond scribe 58 eccentrically mounted in a mandrel 59. The mandrel 59 and hence the diamond scribe 58 may be continuously rotated by an AC motor 60 through the operation of a pulley 61, belt 62 and pulley 64.

The electric motor 60 as well as the pulley 64 carrying the mandrel 59 are mounted on a shift plate 66. The shift plate 66 is capable of being moved downwardly along guide pins 68 by the operation of a solenoid 70. When actuated, the solenoid 70 operates against the force provided by a pair of compression springs 72 carried on guide pins 68. When the solenoid 70 is unactivated, the compression springs 72 bias the shift plate 66 upward such that the diamond scribed 58 does not come in to contact with the web. Upon operation of the solenoid 70, the shift plate 66 is urged downwardly thus bringing the diamond scribe 58 in to contact with the web. Because the diamond scribe is being continuously rotated by the motor 60, the circular scribe mark 22 discussed hereinabove in conjunction with FIG. 3 is scribed onto the web. Other types of scribe marks may be provided.

The diamond scribe 58 is carried by the mandrel 59 such that the diamond scribe 58 moves upwardly within mandrel 59 as the shift plate 66 moves downwardly. This upward movement of the diamond scribe 58 limits the amount of force applied to the web by the diamond scribe 58. A compression spring 74 carried by an arm 75 of the diamond scribe 58 enables the diamond scribe 58 to return to its initial, or down, position when the shift plate 66 is returned to its initial, or up, position.

After the piece of web located within the circular scribe and breakoff assembly 56 has been scribed by the diamond scribe 58, the motor 36 is again energized to index the web along the table 26. This indexing moves the previously circularly scribed piece of web out beyond the edge of the table 26, moves the piece of web previously scribed by the Loomis machine into the circular scribe and breakoff assembly 56, and moves a new portion of the web into the area of the Loomis machine. When the circular scribe and breakoff assembly 56 is now energized, the portion of the web extending beyond the edge of the table 26 will be broken off by a breakoff bar 76 carried by the shift plate 66. As the shift plate 66 moves downward, the scribe 58 is brought into contact with the web and makes the circular scribe mark as it retreats within the mandrel 59. Before the retreat of the circular scribe 58 within the mandrel 59 is complete, the breakoff bar 76 will be brought into contact with that piece of web extending beyond the edge of the table to break the web off along the scribe line made by the work station 50. A sensor 77 may be provided to indicate that a piece of web is positioned within the circular scribe and breakoff assembly 56 to ensure that assembly 56 is not improperly activated. The sensor 77 may be the same type of sensor as sensor 54.

Figure 8:
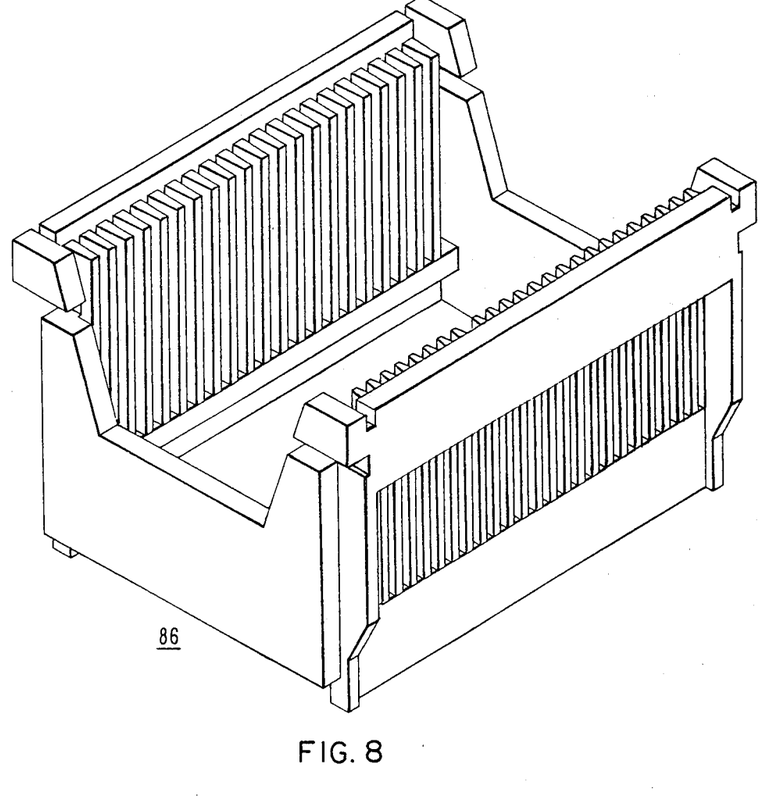
FIG. 8 illustrates the boat used to store the dendritic web pieces after cutting.

As the piece of web extending beyond the table 26 is broken off, it falls onto a first pair of conveyor belts 78 which overlap a second pair of conveyor belts 80. The conveyor belts 78 are a part of a first commercially available elevator 82 while the second pair of conveyor belts 80 are a part of a second commercially available elevator 84. The elevators 82 and 84 may be, for example, two Cybeq 2600 elevators mounted nose to nose at the end of the table 26. The elevators were modified to accept specially made polypropylene boats 86, or cassettes, used for storing the web pieces. The boats 86 are shown in detail in FIG. 8.

A sensor 88 indicates the presence of a piece of web on the first and second pair of conveyor belts 78 and 80, respectively. One of the pair of conveyor belts is energized to convey the piece of web to the boat 86. A sensor 90 indicates when the piece of web is loaded into the boat 86. The sensors 88 and 90 may be the same type of sensor as sensor 54. Once the piece of web is loaded, a ball screw mechanism on the elevator is energized which raises the boat to the next slot so the next piece of web can be loaded. When the boat is full, the other elevator is activated. If both boats are full, the machine 24 stops until one of the boats is replaced.

The operation of the machine 24 may be carried out under the control of discrete logic or by a microprocessor programmed according to known programming techniques. The operation of the microprocessor could, for example, be as follows.

The motor 36 is energized to advance the first piece of web to the work station 50. Sensor 54 is read to ensure that the web is positioned at the work station 50. The work station 50 is energized to scribe a line perpendicular to the longitudinal axis of the web.

After the web has been scribed, motor 36 is again energized to index the web along the table 26 to bring the previously scribed piece of web to the circular scribe and breakoff assembly 56. Sensor 77 is read to ensure that the piece of web is positioned within circular scribe and breakoff assembly 56. At this point both the work station 50 and the solenoid 70 are activated.

Once again the motor 36 is energized to index the web along the table 26 which brings a new piece of web to the work station 50, moves the previously scribed web to the circular scribe and breakoff assembly 56, and moves the previously circularly scribed piece of web out beyond the edge of the table 26. Again, the work station 50 is energized and the solenoid 70 is energized. The piece of web broken off by the breakoff bar 76 falls onto the conveyor belts 78 and 80. Sensor 88 detects the web piece and one pair of conveyor belts is energized to carry the web piece to a boat. Once the web piece is detected by sensor 90, the elevator indexes the boat so that the boat will be able to accept the next piece of web and the machine 24 is started on another cycle. A new cycle is not started if sensor 88 is detecting a web piece. The aforementioned operations are repeated until the entire web has been processed.

As mentioned, it is possible to use types of equipment for the work station 50 other than the Loomis machine previously identified. For example, a laser could be used which would cut through the web. The main advantages of the laser system over diamond scribing are that the breakoff step is eliminated. Assuming that the laser has both x and y degrees of freedom, the circular scribing step could also be eliminated since the laser could be used to etch identification markings into the web. A major draw back to a laser system is that the total cost would be greatly increased over that of a diamond tipped scribing machine. A laser system would also require an enclosure to contain the beam for worker protection. Should a piece of web fracture or other debris be found on the table 26, the laser would need to be shut down in order for worker maintenance.

As an alternative to a laser, a water knife could be used for the work station 50. However, it was found that the cost of the water knife exceeded that for the diamond tipped scribing machine.

While the present invention has been described in connection with an exemplary embodiment thereof, it will be understood that many modifications and variations will be readily apparent to those of ordinary skill in the art. This disclosure and the following claims are intended to cover all such modifications and variations.

We claim as our invention:

1. A machine for automatically cutting a dendritic silicon web into pieces of predetermined length, comprising:
   first work station means for scribing the web to define a web piece of predetermined length;
   second work station means for placing an identifying mark on said web piece and for breaking off said web piece along said scribings; and
   means for advancing the web by said predetermined length through said first and second work stations.

2. The machine of claim 1 additionally comprising storage means and means for conveying said broken off web piece to said storage means.

3. The machine of claim 2 additionally comprising a plurality of sensor means for indicating the presence of the web at said first and second work station means and at said means for conveying.

4. The machine of claim 2 wherein said means for conveying includes a pair of hydraulic elevators each having a conveyor belt, said hydraulic elevators being positioned so that both conveyor belts are responsive to said broken off web piece, said conveyor belts being operable to convey said broken off web piece to said storage means.

5. The machine of claim 1 wherein said second work station means for marking said web piece includes an eccentrically mounted rotatable scribe for placing an identifying mark on a ninety degree corner of said web piece.

6. The machine of claim 5 wherein said second work station means for marking includes solenoid means, and wherein said eccentrically mounted rotatable scribe is carried by a movable shift plate responsive to said solenoid means such that upon actuation of said solenoid means said shift plate moves said scribe into contact with said web piece.

7. A machine for automatically cutting a dendritic silicon web into pieces of predetermined length, comprising:
   first work station means for scribing the web to define a web piece of predetermined length;
   second work station means including (i) an eccentrically mounted rotatable scribe carried by a movable shift plate, and (ii) solenoid means connected to said shift plate such that upon actuation of said solenoid means said shift plate moves said scribe into contact with said web piece for marking said web piece, said second work station means also including a break off bar carried by said shift plate such that upon actuation of said solenoid means said shift plate moves said break off bar into contact with said web piece after said scribe moves into contact with said web piece for breaking off said web piece; and means for advancing the web by said predetermined length through said first and second work station means.

8. The machine of claim 7 wherein said second work station means for marking includes a mandrel carried by said shift plate, said mandrel carrying said scribe such that said scribe retreats within said mandrel as said shift plate moves said scribe into contact with said web piece.

9. The machine of claim 8 wherein said second work station means for marking includes a spring carried by said scribe, said spring being carried such that it causes said scribe to exert pressure on said web piece as said scribe retreats within said mandrel.

10. The machine of claim 1 wherein said first work station means includes an automatic diamond tipped scribe arm.

11. The machine of claim 1 additionally comprising a table for carrying said first and second work station means, said table having an upper surface for supporting the web as it moves through said work station means.

12. The machine of claim 11 wherein said means for advancing includes a pusher bar adapted for contacting an edge of the web for advancing the web along said table.

13. The machine of claim 12 wherein said means for advancing includes a ball nut connected to said pusher bar, and a rotatable ball screw carrying said ball nut such that upon rotation of said ball screw said ball nut travels along said ball screw.

14. The machine of claim 13 wherein said means for advancing includes an electric motor for periodically rotating said ball screw.

15. A machine for automatically cutting a dendritic silicon web into pieces of predetermined length, comprising:

first work station means for scribing the web to define a web piece of predetermined length;

second work station means for marking said web piece and for breaking off said web piece;

a table for carrying said first and second work station means, said table having an upper surface of low friction polyethylene to permit sliding of the web relative thereto, said upper surface supporting the web as it moves through said work station means; and means for advancing the web by said predetermined length through said first and second work station means.

* * * * *